US010218300B2

(12) United States Patent
Ditlow et al.

(10) Patent No.: US 10,218,300 B2
(45) Date of Patent: Feb. 26, 2019

(54) TRANSFORMER PHASE PERMUTATION CAUSING MORE UNIFORM TRANSFORMER PHASE AGING AND GENERAL SWITCHING NETWORK SUITABLE FOR SAME

(71) Applicant: International Business Machines Corporation, Armonk, NY (US)

(72) Inventors: Gary S. Ditlow, Garrison, NY (US); Dung T. Phan, Ossining, NY (US); Jinjun Xiong, Goldens Bridge, NY (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 15/823,912

(22) Filed: Nov. 28, 2017

(65) Prior Publication Data

US 2018/0083561 A1 Mar. 22, 2018

Related U.S. Application Data

(62) Division of application No. 14/193,448, filed on Feb. 28, 2014, now abandoned.

(51) Int. Cl.
*H02P 13/06* (2006.01)
*H02J 3/26* (2006.01)
(Continued)

(52) U.S. Cl.
CPC .............. *H02P 13/06* (2013.01); *H02J 3/005* (2013.01); *H02J 3/26* (2013.01); *G01R 31/027* (2013.01); *H01F 30/14* (2013.01); *Y02E 40/50* (2013.01)

(58) Field of Classification Search
CPC ... H02P 13/06; H02J 3/26; H02J 3/005; H01F 30/14; G01R 31/027
See application file for complete search history.

(56) References Cited

U.S. PATENT DOCUMENTS 6,226,196 B1 5/2001 Toshinari et al.
6,949,942 B2 9/2005 Eldridge et al.
(Continued)

FOREIGN PATENT DOCUMENTS

JP 08-166413 6/1996
JP 10-301647 11/1998

OTHER PUBLICATIONS

Kenneth Duane Harden, "Optimizing Energy Efficiency Standards for Low Voltage Distribution Transformers", May 2011, whole document.

(Continued)

*Primary Examiner* — Regis Betsch
*Assistant Examiner* — Jeremy Delozier
(74) *Attorney, Agent, or Firm* — Harrington & Smith

(57) ABSTRACT

A method includes determining whether transformer phases should be permuted. The method includes, responsive to a determination that the transformer phases should be permuted, permuting the transformer phases, based on historical aging information of transformer input phases, to cause transformer input phases with higher ages to be connected to transformer output phases with lower output loads and transformer input phases with lower ages to be connected to transformer output phases with higher output loads. Multiple apparatus and program products are also disclosed.

6 Claims, 13 Drawing Sheets

(51) Int. Cl.
*H02J 3/00* (2006.01)
*G01R 31/02* (2006.01)
*H01F 30/14* (2006.01)

(56) References Cited

U.S. PATENT DOCUMENTS

| | | | |
|---|---|---|---|
| 2002/0161558 A1* | 10/2002 | Georges | G05B 23/0245 702/189 |
| 2009/0289618 A1 | 11/2009 | Tajima et al. | |
| 2010/0164444 A1* | 7/2010 | Shimazu | H02J 3/1878 323/258 |
| 2012/0187089 A1 | 7/2012 | Chen et al. | |
| 2012/0221265 A1* | 8/2012 | Arya | G01R 29/18 702/61 |
| 2012/0271437 A1 | 10/2012 | Senart et al. | |
| 2012/0291989 A1 | 11/2012 | Danielle et al. | |
| 2013/0043894 A1 | 2/2013 | Wahlroos et al. | |
| 2013/0056210 A1 | 3/2013 | Vinegar et al. | |
| 2013/0096724 A1 | 4/2013 | Divan et al. | |

OTHER PUBLICATIONS

Ajay Khatri, et al. "Optimal Design of Transformer", Apr. 1, 2012, whole document.
A. Prieto, et al., "Optimization of power transformers based on operative service conditions for improved performance",CIGRE 2012, whole document.
"Transformer Protection Principles", IEEE Guide for Protective Relay Applications to Power Transformers, 2000, whole document.
"COS Transformer Protection App Extend Life of Distribution Transformers; Avoid Transformer Outages and Blackouts", www.echelon.com, © 2012 Echelon, whole document.
Schuddebeurs, et al., "A Case Study of Applying a Novel Asset Maintenance Optimization Methodology to Electricity Distribution Utilities using Simulation Strengthened Analytics", The Asset Management Conference, London, UK, 2013, whole document.
IEEE Standard C57.91-1995, IEEE Guide for Loading Mineral-Oil-Immersed Transformers, 1995, whole document.
IEEE Standard IEC 60076-6, "Power Transformers Part 7: Loading guide for oil-immersed power transformers", 2005, whole document.

* cited by examiner $a = a + P_A$ ← 290-1
$b = b + P_B$ ← 290-2
$c = c + P_C$ ← 290-3

FIG. 2A

| iter | a | b | c | $L_{A0}$ | $L_{B0}$ | $L_{C0}$ | $P_A$ | $P_B$ | $P_C$ |
|---|---|---|---|---|---|---|---|---|---|
| 1 | 300 | 100 | 200 | 25 | 10 | 50 | $L_{B0}$ | $L_{C0}$ | $L_{A0}$ |
| 2 | 310 | 150 | 225 | 100 | 50 | 75 | $L_{B0}$ | $L_{A0}$ | $L_{C0}$ |
| 3 | 360 | 250 | 275 | | | | | | |

FIG. 2B

| iter | Sort ascending | Sort descending | $P_A$ | $P_B$ | $P_C$ |
|---|---|---|---|---|---|
| 0 | $P_B P_C P_A$ | $L_{C0} L_{A0} L_{B0}$ | $L_{B0}$ | $L_{C0}$ | $L_{A0}$ |
| 1 | $P_B P_C P_A$ | $L_{A0} L_{C0} L_{B0}$ | $L_{B0}$ | $L_{A0}$ | $L_{C0}$ |

FIG. 2C

| Sort ascending | Sort ascending function (520) | Sort descending | Sort descending function (530) | | $P_A$ (540) | $P_B$ (550) | $P_C$ (560) |
|---|---|---|---|---|---|---|---|
| $P_A P_B P_C$ | $\overline{s_0 s_1 s_2}$ _1_ | $L_{A0} L_{B0} L_{C0}$ | $t_0 t_1 t_2$ _2_ | | $L_{A0}$ _3_ | $L_{B0}$ _4_ | $L_{C0}$ _5_ |
| $P_A P_B P_C$ | $\overline{s_0 s_1 s_2}$ _6_ | $L_{A0} L_{C0} L_{B0}$ | $t_0 t_1 \overline{t_2}$ _7_ | | $L_{A0}$ _8_ | $L_{C0}$ _9_ | $L_{B0}$ _10_ |
| $P_A P_B P_C$ | $\overline{s_0 s_1 s_2}$ _11_ | $L_{B0} L_{A0} L_{C0}$ | $\overline{t_0 t_1}$ _12_ | | $L_{B0}$ _13_ | $L_{A0}$ _14_ | $L_{C0}$ _15_ |
| $P_A P_B P_C$ | $\overline{s_0 s_1 s_2}$ | $L_{B0} L_{C0} L_{A0}$ | $\overline{t_0} t_1 t_2$ | | $L_{B0}$ | $L_{C0}$ | $L_{A0}$ |
| $P_A P_B P_C$ | $\overline{s_0 s_1 s_2}$ | $L_{C0} L_{A0} L_{B0}$ | $t_0 \overline{t_1}$ | | $L_{C0}$ | $L_{A0}$ | $L_{B0}$ |
| $P_A P_B P_C$ | $\overline{s_0 s_1 s_2}$ | $L_{C0} L_{B0} L_{A0}$ | $\overline{t_0 t_1 t_2}$ | | $L_{C0}$ | $L_{B0}$ | $L_{A0}$ |
| $P_A P_C P_B$ | $\overline{s_0 s_1 s_2}$ _16_ | $L_{A0} L_{B0} L_{C0}$ | $t_0 t_1 t_2$ _17_ | | $L_{A0}$ _18_ | $L_{C0}$ _19_ | $L_{B0}$ _20_ |
| $P_A P_C P_B$ | $\overline{s_0 s_1 s_2}$ _21_ | $L_{A0} L_{C0} L_{B0}$ | $t_0 t_1 \overline{t_2}$ _22_ | | $L_{A0}$ _23_ | $L_{B0}$ _24_ | $L_{C0}$ _25_ |
| $P_A P_C P_B$ | $\overline{s_0 s_1 s_2}$ _26_ | $L_{B0} L_{A0} L_{C0}$ | $\overline{t_0} t_1$ _27_ | | $L_{B0}$ _28_ | $L_{C0}$ _29_ | $L_{A0}$ _30_ |
| $P_A P_C P_B$ | $\overline{s_0 s_1 s_2}$ | $L_{B0} L_{C0} L_{A0}$ | $\overline{t_0} t_1 t_2$ | | $L_{B0}$ | $L_{A0}$ | $L_{C0}$ |
| $P_A P_C P_B$ | $\overline{s_0 s_1 s_2}$ | $L_{C0} L_{A0} L_{B0}$ | $t_0 \overline{t_1}$ | | $L_{C0}$ | $L_{B0}$ | $L_{A0}$ |
| $P_A P_C P_B$ | $\overline{s_0 s_1 s_2}$ | $L_{C0} L_{B0} L_{A0}$ | $\overline{t_0 t_1 t_2}$ | | $L_{C0}$ | $L_{A0}$ | $L_{B0}$ |
| ... | | | | | | | |

585-1 brackets the first group ($P_A P_B P_C$ rows); 585-2 brackets the second group ($P_A P_C P_B$ rows).

$$P_A = \overline{s_0 s_1 s_2 t_0 t_1 t_2} L_{A0} + \overline{s_0 s_1 s_2 t_0 t_1 \overline{t_2}} L_{A0} = \overline{s_0 s_1 s_2 t_0 t_1} L_{B0} + \ldots$$
$$P_B = \overline{s_0 s_1 s_2 t_0 t_1 t_2} L_{B0} + \overline{s_0 s_1 s_2 t_0 t_1 \overline{t_2}} L_{C0} = \overline{s_0 s_1 s_2 t_0 t_1} L_{A0} + \ldots$$
$$P_C = \overline{s_0 s_1 s_2 t_0 t_1 t_2} L_{C0} + \overline{s_0 s_1 s_2 t_0 t_1 \overline{t_2}} L_{B0} = \overline{s_0 s_1 s_2 t_0 t_1} L_{C0} + \ldots$$

TRANSFORMER PHASE PERMUTATION CAUSING MORE UNIFORM TRANSFORMER PHASE AGING AND GENERAL SWITCHING NETWORK SUITABLE FOR SAME

CROSS-REFERENCE TO RELATED APPLICATION

This application is a divisional of U.S. patent application Ser. No. 14/193,448, filed Feb. 28, 2014.

BACKGROUND

This invention relates generally to power systems such as three-phase power systems and, more specifically, relates to transformers for these power systems.

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section.

Three-phase power systems use transformers for purposes such as voltage modification, e.g., to increase or decrease voltage. The more a transformer is loaded, the faster the transformer ages. An increased load will cause temperatures of certain portions of the transformer to rise. As temperature rises, the insulation in the transformer degrades. This degradation is a sign that the transformer is aging.

Typical transformers used in three-phase systems have three phases (A,B,C), each with a different load on the phase. The phases can degrade at different rates because of this load variation. Once a phase begins to degrade, transformer performance suffers. After some amount of degradation on a phase, the transformer will have to be replaced.

BRIEF SUMMARY

The following summary is merely intended to be exemplary. The summary is not intended to limit the scope of the claims.

An exemplary embodiment is a method including determining whether transformer phases should be permuted. The method also includes responsive to a determination that the transformer phases should be permuted, permuting the transformer phases, based on historical aging information of transformer input phases, to cause transformer input phases with higher ages to be connected to transformer output phases with lower output loads and transformer input phases with lower ages to be connected to transformer output phases with higher output loads.

In another exemplary embodiment, an apparatus includes a permutation circuit and a controller. The controller is configured to determine whether transformer phases should be permuted, wherein the controller, responsive to a determination that the transformer phases should be permuted, is further configured to cause the permutation circuit to permute the transformer phases. The permuting is based on historical aging information of transformer input phases and causing transformer input phases with higher age to be connected to transformer output phases with lower output load and transformer input phases with lower age to be connected to transformer output phases with higher output load.

In a further exemplary embodiment, an apparatus comprises first and second sorting networks. The first sorting network comprises a first logic circuit configured to sort input transformer phases to age-sorted phases based on historical aging information for the input transformer phases. The sorting is performed so the age-sorted phases are always in a first particular order based on corresponding ages of the input transformer phases. The first logic circuit is further configured to connect the transformer input phases to outputs for the age-sorted phases based on the first particular order. The second sorting network comprises a second logic circuit configured to sort transformer output phases to load-sorted phases based on output load for each of the transformer output phases, wherein the sorting is performed so the load-sorted phases are always in a second particular order based on the output loads. The second logic circuit is configured so that load-sorted phases and the age-sorted phases are connected so the outputs for the age-sorted phases with lower age are connected to inputs for load-sorted phases with higher output loads and the outputs for the age-sorted phases with higher age are connected to inputs for load-sorted phases with lower output loads. The second logic circuit is further configured to connect the inputs for the load-sorted phases to the output transformer phases based on the second particular order.

In a further exemplary embodiment, an apparatus includes a first sorting network comprising a first logic circuit configured to sort input signals A, B, C, wherein the sorting is performed so the signals A, B, C are always in a first particular order based on values of the signals A, B, C, the first logic circuit further configured to connect the input signals A, B, C to first outputs based on the first particular order. The apparatus includes a second sorting network comprising a second logic circuit configured to sort output signals A0, B0, C0 to second outputs based on values of the output signals A0, B0, C0, wherein the sorting is performed so the second outputs are always in a second particular order based on the values of the output signals A0, B0, C0, wherein the second logic circuit is further configured to connect the second outputs to the output signals A0, B0, C0, based on the second particular order. The apparatus further includes connection circuitry configured so that first outputs and the second outputs are connected so the first outputs with lower values are connected to second outputs with higher values and the first outputs with higher values are connected to second outputs with lower values.

BRIEF DESCRIPTION OF THE SEVERAL VIEWS OF THE DRAWINGS

FIG. 2A is an example of using three adders to perform an age update;

FIG. 2B is an example of a number of iterations and values and assignments that occur for phases, loads, and loads that phases {A, B, C} see for optimal load balancing;

FIG. 2C is an example of a number of iterations, output of computations, and assignments that occur for the sort ascending network, the sort descending network, and loads that phases {A, B, C} see for optimal load balancing;

FIG. 5 is table illustrating how to compute the resultant loads $\{P_A, P_B, P_C\}$ from the sorting networks;

FIG. 6 illustrates a 6×6 matrix and is another example of how to compute the resultant loads $\{P_A, P_B, P_C\}$ from the sorting networks;

FIG. 9, including

DETAILED DESCRIPTION

Exemplary embodiments herein minimize transformer aging by permuting phases. For instance, if historical aging information (e.g., based on loading per phase) is maintained for each phase, then the phases can be permuted so that (1) the highest aged phase will have the lowest load and (2) the lowest aged phase will have the highest load. Thus, over time, the three phases (labeled generally as A, B, C herein) will age more uniformly. This will lengthen the life of a transformer instead of having one phase age prematurely and requiring replacement of the transformer due to early aging of one phase.

Two sorting networks are used in an exemplary embodiment: one sorting network is used to sort the input phases by age (e.g., an ascending sort); and one sorting network is used to sort the output phases by load (e.g., or age-equivalent load) (e.g., a descending sort). The outputs of each sorted network are connected so that the most highly aged phase has the lowest load and the least highly aged phase has the highest load (and, e.g., the middle aged phase has the middle load).

There are many ways to formulate transformer aging. Examples are provided below.

Figure 1A:
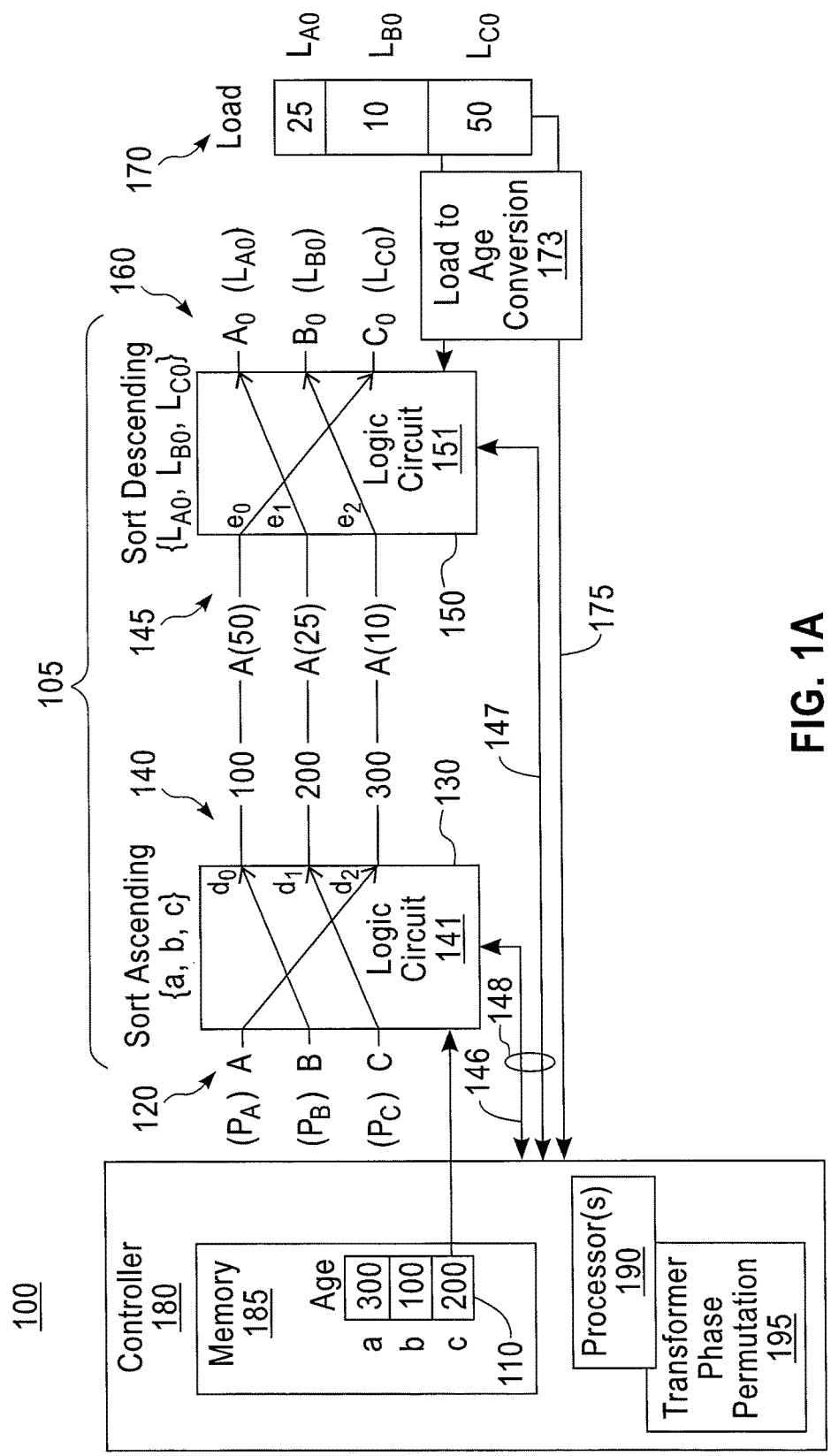
FIG. 1A is a block diagram of an exemplary system for performing transformer phase permutation to minimize transformer aging, shown at a first iteration.

Turning to FIG. 1A, a block diagram is shown of an exemplary system 100 for performing transformer phase permutation causing more uniform transformer phase aging. The transformer phase permutation system 100 comprises a permutation circuit 105 that comprises an age sorting network 130 and a load sorting network 150. Each of the age sorting network 130 and the load sorting network 150 may be implemented, e.g., by a logic circuit 131 or 151, respectively. The historical aging information 110 is a memory (e.g., or is stored in a memory 185) storing such information for each of the input phases A, B, and C 120. In this example, "a" is the age of input phase A 120, "b" is the age of input phase B 120, and "c" is the age of input phase C 120. The values a, b, c may be latched values that are updated periodically. The age sorting network 130 sorts, based on the historical aging information 110, the input phases 120 to produce a descending output for the sorted phases 140. That is, the age-sorted phases 140 of $d_0$, $d_1$, and $d_2$ are sorted corresponding to ages 100, 200, and 300, such that input phase B 120 is connected to the sorted phase $d_0$ 140, input phase C 120 is connected to the sorted phase $d_1$ 140, and input phase A 120 is connected to the sorted phase $d_2$ 140. It is noted that the ages being used are merely exemplary and used for ease of description.

The load sorting network 150 sorts the load-sorted phases 145 based on the output loads 170, which are, in this example, 25 for output load $L_{A0}$ 170 (e.g., on phase $A_0$), 10 for output load $L_{B0}$ 170 (e.g., on phase $B_0$), and 50 for output load $L_{C0}$ 170 (e.g., on phase $C_0$). In order to make a comparison between the sorted phases 140, which are based on ages, and the output loads 170, it can be helpful to perform a load to age conversion, as performed by logic circuit 173. Output 175 from the load to age conversion logic circuit 173 will also be sent to the controller 185, in order for the controller to create or update the historical aging information 110. Load to age conversion may be performed by many techniques, including those techniques in the following: IEEE Standard C57.91-1995, "IEEE Guide for Loading Mineral-Oil-Immersed Transformers" (1995); and IEEE Standard IEC 60076-6, "Power Transformers Part 7: Loading guide for oil-immersed power transformers" (2005).

In this example, the age-converted, load-sorted phases 145 are as follows: the age estimate $e_0$ corresponds to the output load $L_{C0}$ 170 of 50 (on output phase $C_0$ 160), the age estimate $e_1$ corresponds to the output load $L_{A0}$ 170 (on output phase $A_0$ 160) of 25, and the age estimate $e_2$ corresponds to the output load $L_{B0}$ 170 of 10 (on output phase $B_0$ 160). Thus, the loads 10, 25, and 50 (and their corresponding age estimates, A(10), A(25), and A(50)) are sorted in a descending manner for this example. The output phases 160 are therefore connected as follows: output phase $A_0$ 160 is connected to $e_1$; output phase $B_0$ 160 is connected to $e_2$; and output phase $C_0$ 160 is connected to $e_0$.

This means that the input transformer phases 120 are connected to output transformer phases 160 as follows: input phase A 120 is connected to output phase $B_0$ 160; input phase B 120 is connected to output phase $C_0$ 160; and input phase C 120 is connected to output phase $A_0$ 160. Thus, the input phase 120 with the highest age in historical aging information 110 (i.e., input phase A 120 with an age of 300) is connected to the output phase 160 with the lowest load (i.e., output phase $B_0$ 160 with a load of 10), the input phase 120 with the lowest age in historical aging information 110 (i.e., input phase B 120 with an age of 100) is connected to the output phase 160 with the lowest load (i.e., output phase $C_0$ 160 with a load of 50), and the input phase 120 with the middle age in historical aging information 110 (i.e., input phase C 120 with an age of 200) is connected to the output phase 160 with the middle load (i.e., output phase $A_0$ 160 with a load of 25).

In examples herein, $\{P_A, P_B, P_C\}$ are the "resultant" loads that input phases 120 {A, B, C} see for optimal phase balancing, e.g., in order to create more uniform transformer phase aging at any given instant. In these examples, the system 100 operates to compute the resultant loads $\{P_A, P_B, P_C\}$ relative to $\{L_{A0}, L_{B0},$ and $L_{C0}\}$, which are loads on output phases 160 $\{A_0, B_0,$ and $C_0\}$, respectively. These examples are described in more detail below. It is noted that the loads $L_{A0}, L_{B0},$ and $L_{C0}$ are technically loads and not ages, and these loads are expected to be converted into equivalent ages for comparison. However, for ease of reference and for simplicity, the $L_{A0}, L_{B0},$ and $L_{C0}$ are primarily used herein using their load information, although such load information would typically be converted to corresponding ages.

One possible implementation shown in FIG. 1A is a controller 180 that comprises a memory 185, one or more processors 190, and a transformer phase permutation process 195. The controller is, e.g., a microcontroller, programmable logic device, small computer system, or the like. The historical aging information 110 is contained in the memory 185 and the controller 180 determines the historical aging information 110 using the output loads 170, reported to the controller 180, e.g., via output 175. Depending upon implementation, the processor(s) 190 is one possible circuit for implementing the techniques described herein. For instance, the processor could be a general-purpose processor, digital signal processor, a processor core used in a microcontroller, or other suitably programmable device, and the transformer phase permutation process 195 could be part of memory 185 and be computer-readable code that is executed by the processor(s) 190. The execution of the transformer phase permutation process 195 causes the processor 190 (and the controller 180) to perform certain of the techniques presented herein. In another example, the transformer phase permutation process 195 could be completely programmed in hardware, such as an integrated circuit. As a further example, if the implementation is via a programmable logic device for instance, the transformer phase permutation process 195 would be used to configure the programmable logic device to perform certain of the techniques presented herein.

In this example, the controller 180 controls the permutation circuit 105 to cause the permutation circuit 105 to permute the phases. Particularly, the permutation circuit 105 controls the age sorting network 130 via a control signal 146 and controls the load sorting network 150 via a control signal 147. For instance, the controller 180 may cause the sorting of the ages and the output loads, e.g., periodically or if a output load 170 changes. The two sorting networks 130, 150 may be independently controlled via the two control signals 146, 147 (e.g., should timing necessitate this) or could be controlled by a single control signal 148. It is further noted that the signals 146 and 147 may further include in certain exemplary embodiments the outputs of $s_0$, $s_1$, $s_2$ (on signal 146) and $t_0$, $t_1$, $t_2$ (on signal 147) as described below.

In an exemplary embodiment, each sorting network is comprised of three comparators, each running in parallel. The sort ascending network computes outputs referred to as $s_0$, $s_1$, $s_2$ while the sort descending network computes outputs referred to as $t_0$, $t_1$, $t_2$. Once computed, these signals change the state of the network so that heavily aged phases see lighter loads for more uniform transformer aging. These signals are also used as select signals for multiplexors (in an exemplary embodiment described below) so that the transformer aging updates are performed properly.

It is noted power flows from A,B,C to $A_O$, $B_O$, $C_O$, and that, in an exemplary embodiment, the latched values a,b,c and $L_{AO}$, $L_{BO}$, $L_{CO}$ are inputs to comparators which compute selects for muxes to determine how power flows in the switching network. Also, after updating a,b,c in an exemplary embodiment, the state of $L_{AO}$, $L_{BO}$, $L_{CO}$ should be reset to zero, indicating that a new time interval for transformer aging has begun.

The system 100 in FIG. 1A is shown at a first iteration. In FIG. 1A, the changes in age are as follows:

$$a=a+\text{age}(L_{BO})=a+P_A=300+10=310, P_A=\text{age}(L_{BO});$$

$$b=b+\text{age}(L_{CO})=b+P_B=100+50=150, P_B=\text{age}(L_{CO});$$
and $$c=c+\text{age}(L_{AO})=c+P_C=200+25=225, P_C=\text{age}(L_{AO}),$$

where age( ) converts load to age; This 'age' conversion would compare, in an exemplary embodiment, the load against the transformer rating and set the age accordingly. If the load is higher than the rating, the transformer will age at an accelerated rate. Conversely, if the load is less than the rating, then the transformer will age at a reduced rate. As stated above, in exemplary embodiments, the resultant loads $\{P_A, P_B, P_C\}$ are the loads that input phases $\{A, B, C\}$ 120 see for optimal phase balancing. The system 100 in exemplary embodiments operates to compute the resultant loads $\{P_A, P_B, P_C\}$ relative to $\{L_{AO}, L_{BO}, \text{and } L_{CO}\}$, which are loads on output phases 160 $\{A_O, B_O, \text{and } C_O\}$, respectively. Thus, the historical aging information 110 changes from $\{300, 100, 200\}$ to $\{310, 150, 225\}$, which means that the transformer phase aging is more uniform.

Figure 1B:
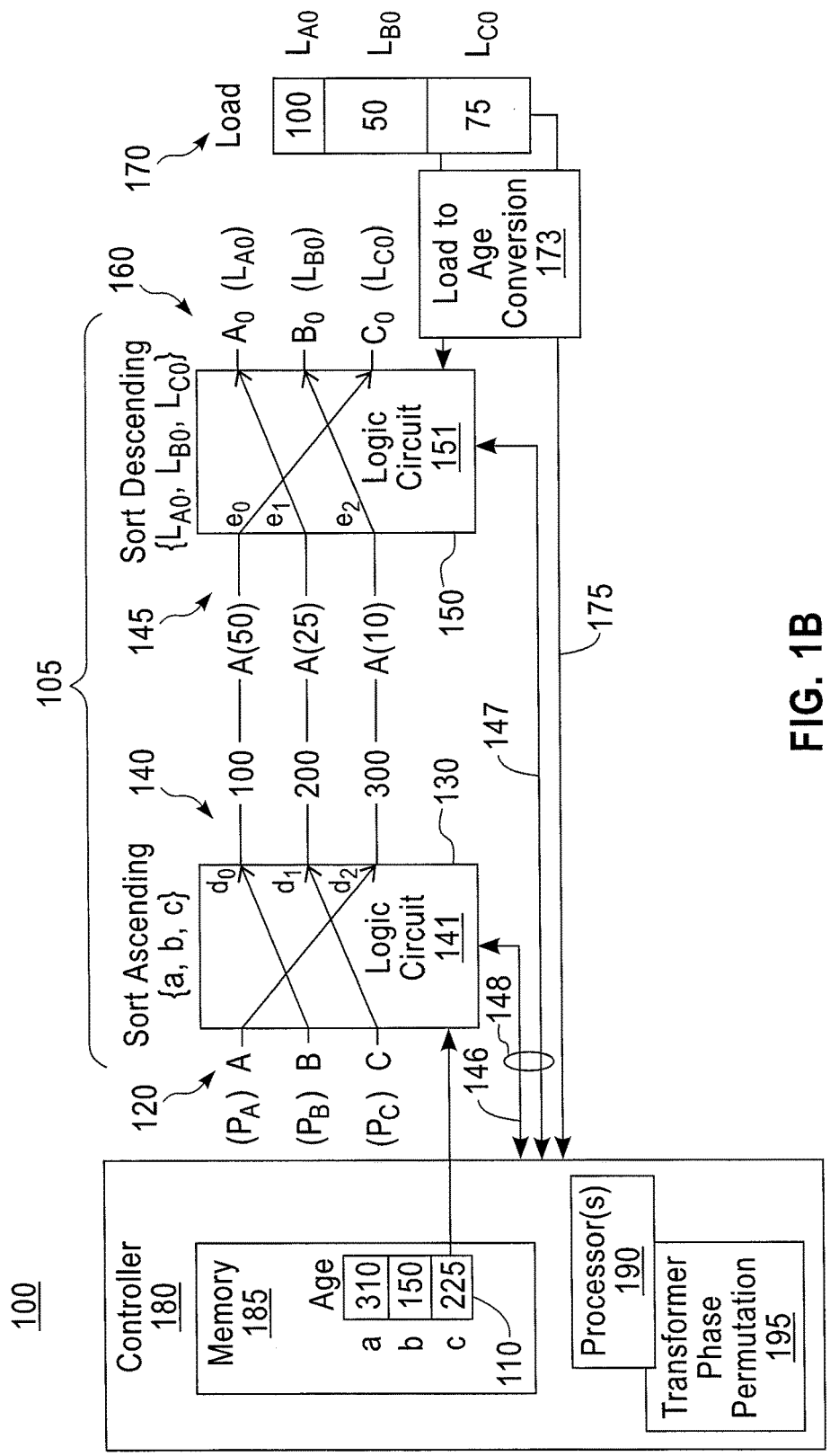
FIG. 1B is a block diagram of the exemplary system of FIG. 1A, shown at a second iteration.

Turning to FIG. 1B, this figure shows the system of FIG. 1A at a second iteration. In this example, the output load information 170 is now $\{100, 50, 75\}$ for $L_{AO}$, $L_{BO}$, and $L_{CO}$, respectively. In FIG. 1B, the changes in age are as follows:

$$a=a+\text{age}(L_{BO})=a+P_A=310+50=360, P_A=\text{age}(L_{BO})$$

$$b=b+\text{age}(L_{AO})=b+P_B=150+100=250, P_B=\text{age}(L_{AO})$$

$$c=c+\text{age}(L_{CO})=c+P_C=225+75=295, P_C=\text{age}(L_{CO})$$

This further causes more uniform transformer aging of phases. For instance, the original historical aging information 110 was $\{300, 100, 200\}$, which as a percentage of the highest age was $\{100, 33.3, \text{and } 66.7\}$. The ending historical aging information 110 is $\{360, 250, 295\}$, which as a percentage of the highest age is $\{100, 69.4, \text{and } 81.9\}$. Thus, the historical age for each phase is more uniform after the second iteration.

There are transformer phase permutation equations that may be used to perform the permutation. For instance an age update may be performed using three adders 290-1, 290-1, and 290-3 as shown in FIG. 2A. The three adders 290-1, 290-1, and 290-3 perform the following: $a=a+P_A$; $b=b+P_B$; and $c=c+P_C$, respectively.

Referring to FIG. 2B, this figure is an example of a number of iterations ("iter" in the figure) and values and assignments that occur for phases, loads, and loads that phases $\{A, B, C\}$ see for optimal load balancing. This figure shows the assigned age for each of the $\{A, B, C\}$ for each iteration. For instance, the phase A starts at 300 for the first iteration, is 310 at the second iteration, and is 360 at the third iteration. The output loads 170 are also shown as $L_{AO}$, $L_{BO}$, and $L_{CO}$ for each iteration, e.g., $L_{AO}$ is shown as 25 for iteration 1 and 100 for iteration 2. The loads $P_A$, $P_B$, and $P_C$ are also shown, as are their assigned output loads 170 for iterations 1 and 2. For instance, the load $P_B$ is assigned to the output load $L_{CO}$ for iteration 1 and to output load $L_{AO}$ for iteration 2.

FIG. 2C is an example of a number of iterations, output of computations, and assignments that occur for the sort ascending network, the sort descending network, and loads that phases $\{A, B, C\}$ see for optimal load balancing. FIG. 2C is directed to two iterations, zero and one, and illustrates the output of computations for the loads $P_A$, $P_B$, and $P_C$, and assignments that occur for the age sorting network 130 (using a sort ascending algorithm) and the load sorting network 150 (using a sort descending algorithm). The sort ascending algorithm in the age sorting network 130 sorts as follows for iterations zero and one: {$P_B$, $P_C$, $P_A$} and {$P_B$, $P_C$, $P_A$}, respectively. The sort descending algorithm in the load sorting network 150 sorts as follows for iterations zero and one: {$L_{C0}$, $L_{A0}$, $L_{B0}$} and {$L_{A0}$, $L_{C0}$, $L_{B0}$}, respectively. In order to perform these computations, it would be beneficial to efficiently compute the assignments for the loads {$P_A$, $P_B$, $P_C$}.

Exemplary embodiments for efficiently computing the assignments for the loads {$P_A$, $P_B$, $P_C$} are described in more detail below. Before describing computation of the assignments, it is helpful to describe exemplary embodiments for the sort descending and sort ascending networks (e.g., 141, 151, respectively).

Figure 3A:
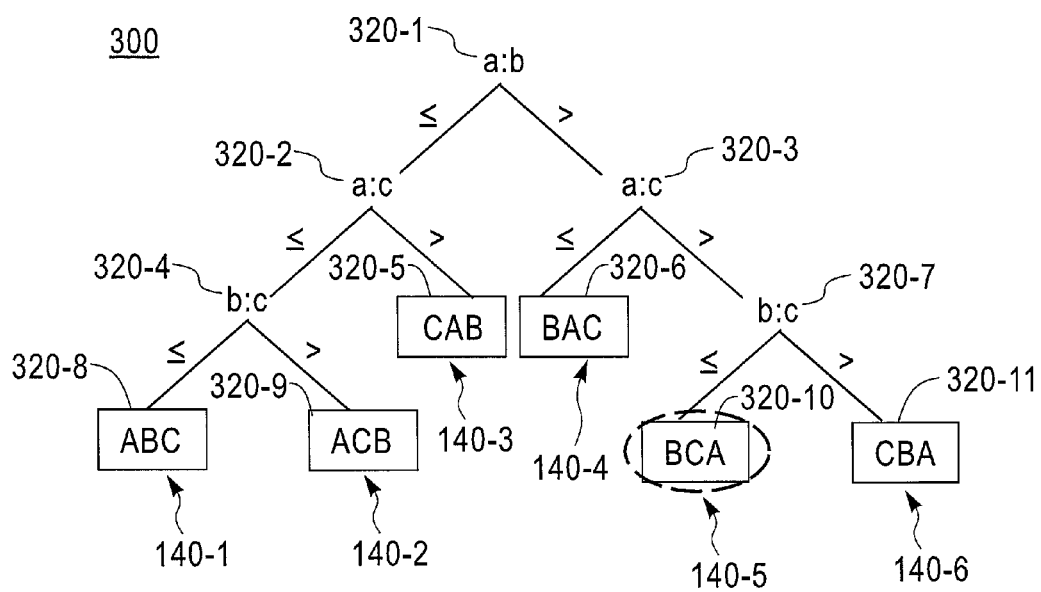
FIG. 3A is a diagram of logical operations performed by the age sorting network to sort transformer phases.
Figure 3B:
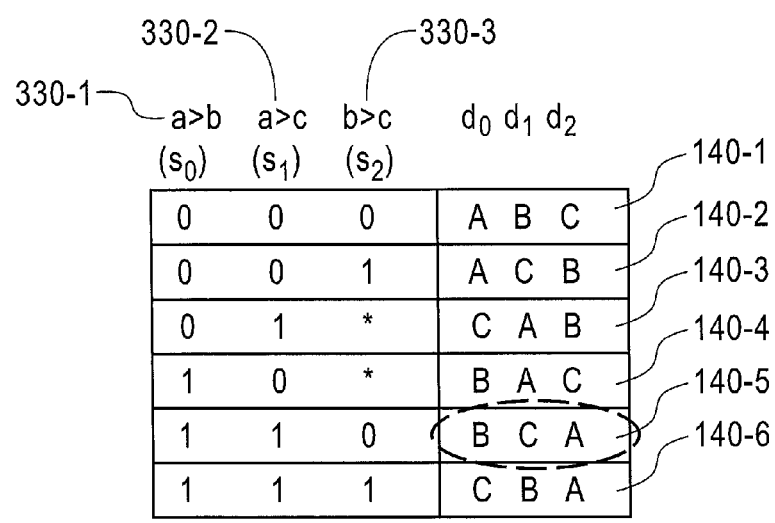
FIG. 3B is a table corresponding to the logical operations of FIG. 3A.

Turning to FIGS. 3A and 3B, FIG. 3A is a diagram of logical operations performed by the age sorting network 130 (e.g., the logic circuit 141 thereof) to sort transformer phases, and FIG. 3B is a table corresponding to the logical operations of FIG. 3A. FIG. 3B may also be implemented by a logic circuit 141. FIG. 3A uses a tree structure 300 to perform logical operations. The tree structure 300 has 11 nodes 320 in this example and starts at the "trunk" node 320-1 of "a:b". If a≤b, then node 320-2 of "a:c" is reached, whereas if a>b, node 320-3 of "a:c" is reached. Nodes 320-4 through 320-11 may be reached similarly. Nodes 320-8, 320-9, 320-5, 320-6, 320-10, and 320-11 correspond to age-sorted phases 140-1 through 140-6 of the following: ABC, ACB, CAB, BAC, BCA, or CBA, respectively. The age-sorted phase 140-5 is circled, as this phase corresponds to the age-sorted phases 140 in FIG. 1A.

FIG. 3B is another way of looking at and performing the logic operations for FIG. 3A. In this figure, the table shown is a logic table (also called a truth table) of input variables ($s_0$, a>b; $s_1$, a>c; and $s_2$, b>c) and outputs $d_0$, $d_1$, and $d_2$. An asterisk indicates a "don't care", as it is immaterial whether the input variable in that entry is 0 (false) or 1 (true). In terms of logic operations (e.g., performed by a logic circuit), these are as follows (where ⊕ is XOR and the bar above a variable is a NOT operator):

$$d_0 = \overline{s_0 s_1} A + s_0 (\overline{s_1} + \overline{s_2}) B + s_1 (\overline{s_0} + \overline{s_2}) C$$

$$d_1 = (s_0 \oplus s_1) A + (\overline{s_0 s_1 s_2} + s_0 s_1 s_2) B + (\overline{s_0 s_1} s_2 + s_0 s_1 \overline{s_2}) C$$

$$d_2 = s_0 s_1 A + \overline{s_0}(s_1 + \overline{s_2}) B + \overline{s_1}(s_0 + \overline{s_2}) C$$

These operations can easily be transformed into a logic circuit 141 comprising logic gates and routing. In particular, three comparators may be used: a comparator 330-1 of a>b; a comparator 330-2 of a>c; and a comparator 330-3 of b>c. Furthermore, three multiplexors would also be used (one multiplexor for each of $d_0$, $d_1$, and $d_2$, e.g., as per the equations above).

A simple example is now presented to illustrate the operation of FIGS. 3A and 3B. To reach the age-sorted phases 140-5, which are the age-sorted phases 140 of FIG. 1A, age "a" is greater than age "b", so the age sorting network 130 transitions from node 320-1 to node 320-3. The age "a" is greater than the age "c", so the age sorting network 130 transitions from node 320-3 to node 320-7. The age "b" is less than the age "c", and the age sorting network 130 transitions from node 320-7 to 320-10, where the age-sorted phases 140 are BCA.

For an age sorting network 130 implementing FIG. 3B, the age "a" is greater than the age "b", therefore the entry for this variable ($s_0$) is a 1 (true). Similarly, the age "a" is greater than the age "c", therefore the entry for this variable ($s_1$) is a 1 (true). The age "b" is not greater than the age "c", therefore the entry for this variable ($s_2$) is a 0 (false). An age sorting network 130 implementing this would then produce the age-sorted phases 140-5 of BCA. This may also be seen using the equations from above. Based additionally on $\overline{s_0}=0$, $\overline{s_1}=0$ and $\overline{s_2}=1$, the above equations are as follows:

$$d_0 = 00A + 1(0+1)B + 1(0+0)C = 1(1)B = B$$

$$d_1 = (1 \oplus 1)A + (001+110)B + (001+111)C = 0A + (0)B + (0+1)C = C$$

$$d_2 = 11A + 0(1+0)B + 0(1+1)C = 1A + 0B + 0C = A$$

Figures 4A, 4B:
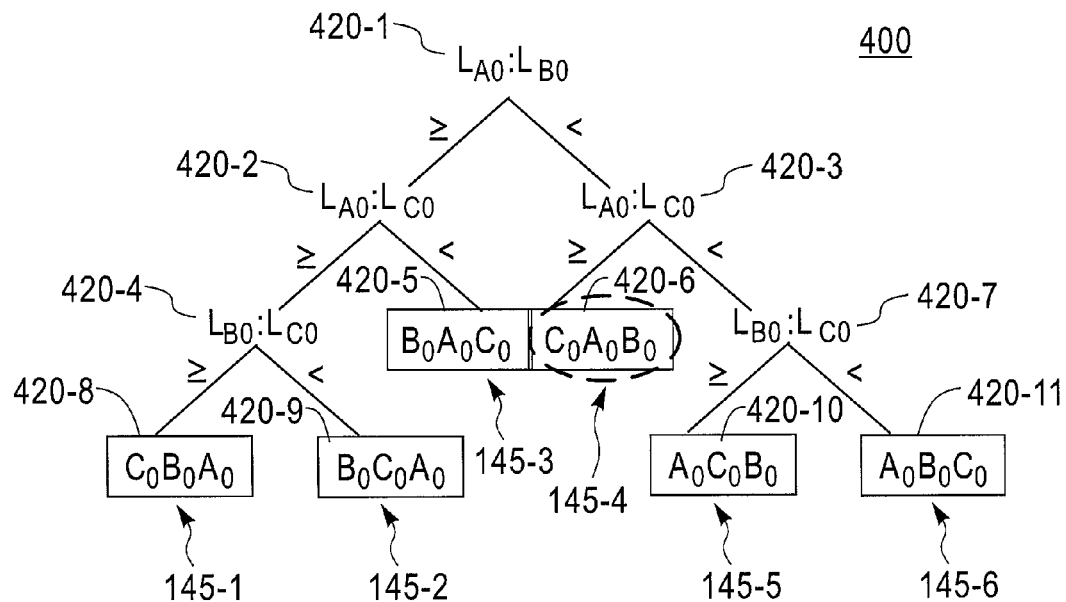
FIG. 4A is a diagram of logical operations performed by the load sorting network to sort transformer phases.
FIG. 4B is a table corresponding to the logical operations of FIG. 4A.

Turning to FIG. 4A, a diagram is shown of logical operations performed by the load sorting network (e.g., the logic circuit 151 thereof) to sort transformer phases. FIG. 4A uses a tree structure 400 to perform logical operations. The tree structure 400 has 11 nodes 420 in this example and starts at the "trunk" node 420-1 of "$L_{A0}$:$L_{50}$". If $L_{A0} \geq L_{B0}$, then node 420-2 of "$L_{A0}$:$L_{C0}$" is reached, whereas if $L_{A0} < L_{B0}$, node 420-3 of "$L_{A0}$:$L_{C0}$" is reached. Nodes 420-4 through 420-11 may be reached similarly. Nodes 420-8, 420-9, 420-5, 420-4, 420-10, and 420-11 correspond to load-sorted phases 145-1 through 145-6 of the following: $C_0B_0A_0$, $B_0C_0A_0$, $B_0A_0C_0$, $C_0A_0B_0$, $A_0C_0B_0$, and $A_0B_0C_0$, respectively. The load-sorted phase 145-4 is circled, as this phase corresponds to the load-sorted phase 145 in FIG. 1A.

The logical operations in load sorting network 150 (e.g., and the logic circuit 151) need to connect paths from load-sorted phases 145 {$e_0$, $e_1$, $e_2$} to output phases 160 {$A_0$, $B_0$, $C_0$} controlled by loads {$L_{A0}$, $L_{B0}$, $L_{C0}$}. An exemplary implementation of a logic circuit 151 and the load sorting network 150 comprises nine pass transistors, one for each connection {$e_0$, $e_1$, $e_2$}×{$A_0$, $B_0$, $C_0$}. See also FIG. 4B, which is an example of a table for logical operations performed by the load sorting network 150 and the logic circuit 151. The logic controlling pass transistor $e_0 A_0$ is the following: ($L_{A0} \geq L_{B0}$) & ($L_{A0} \geq L_{C0}$). That is, $e_0$ is the maximum of {$L_{A0}$, $L_{B0}$, $L_{C0}$} and the maximum is $L_{A0}$. Thus, the load sorting network 150 connects $e_0$ to $A_0$. This can be seen in FIG. 4B, as the $A_0$ for $e_0$ is in the upper two columns, and the entries for the logic variables corresponding to $A_0$ in the variables $t_0$ and $t_1$. Thus, for the transistor $e_0 A_0$ to be turned on, both ($L_{A0} \geq L_{B0}$) (for variable $t_0$) and ($L_{A0} \geq L_{C0}$) (for variable $t_1$). Similar mathematics may be determined (using the table in FIG. 4B) for each pass transistor $e_x Y_0$, where $e_x$ is one of $e_0$, $e_1$, or $e_2$, and $Y_0$ is one of $A_0$, $B_0$, or $C_0$.

For instance, the logic controlling pass transistor $e_2 B_0$ is ($L_{B0} \leq L_{A0}$) & ($L_{B0} \leq L_{C0}$). That is, $e_2$ is the minimum of {$L_{A0}$, $L_{B0}$, $L_{C0}$} and the minimum is $L_{B0}$. The load sorting network 150 connects $e_2$ to $B_0$. Of the nine pass transistors, only three will be turned on: $e_0$ connects to one of {$A_0$, $B_0$, $C_0$}; $e_1$ connects to one of {$A_0$, $B_0$, $C_0$}; and $e_2$ connects to one of {$A_0$, $B_0$, $C_0$}. Equations that may be used to determine $e_0$, $e_1$, and $e_2$ are as follows:

$$e_0 = t_0 t_1 A_0 + \overline{t_0}(t_1 + t_2) B_0 + \overline{t_1}(t_0 + \overline{t_2}) C_0$$

$$e_1 = (t_0 \oplus t_1) A_0 + (\overline{t_0 t_1 t_2} + t_0 t_1 t_2) B_0 + (\overline{t_0 t_1} t_2 + t_0 t_1 \overline{t_2}) C_0$$

$$e_2 = \overline{t_0 t_1} A_0 + t_0 (\overline{t_1} + \overline{t_2}) B_0 + t_1 (\overline{t_0} + t_2) C_0$$

Note that $A_0$ can be considered to be $L_{A0}$, $B_0$ can be considered to be $L_{B0}$, and $C_0$ can be considered to be $L_{C0}$.

As another example of a possible hardware implementation, three comparators may be used (see FIG. 4B): a comparator 430-1 of $L_{A0} < L_{B0}$; a comparator 430-2 of $L_{A0} < L_{C0}$; and a comparator 430-3 of $L_{B0} < L_{C0}$. Furthermore, three multiplexors would also be used (one multiplexor for each of $e_0$, $e_1$, and $e_2$, e.g., as per the equations above).

Figure 9A:
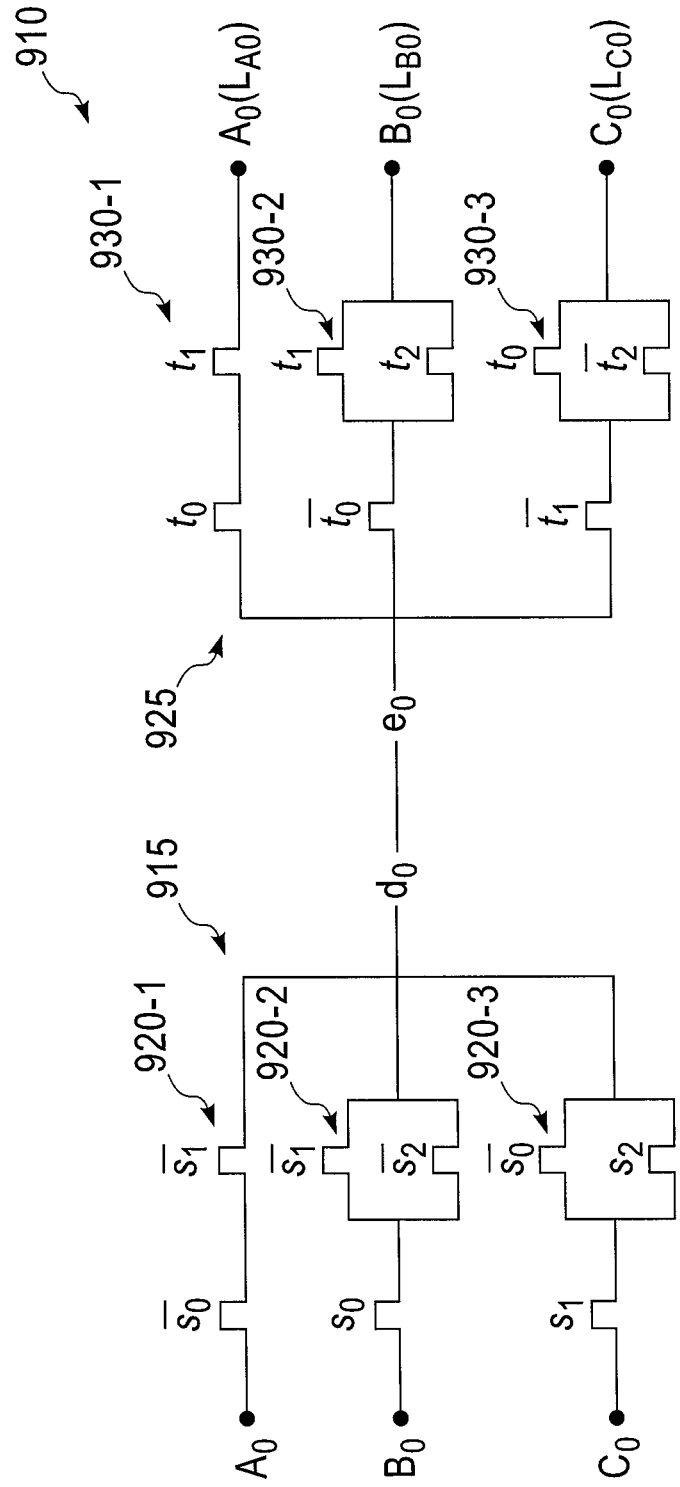
FIGS. 9A, 9B, 9C, and 9D illustrates examples of a circuit including multiplexor circuits suitable for transformer phase permutation.
Figure 9B:
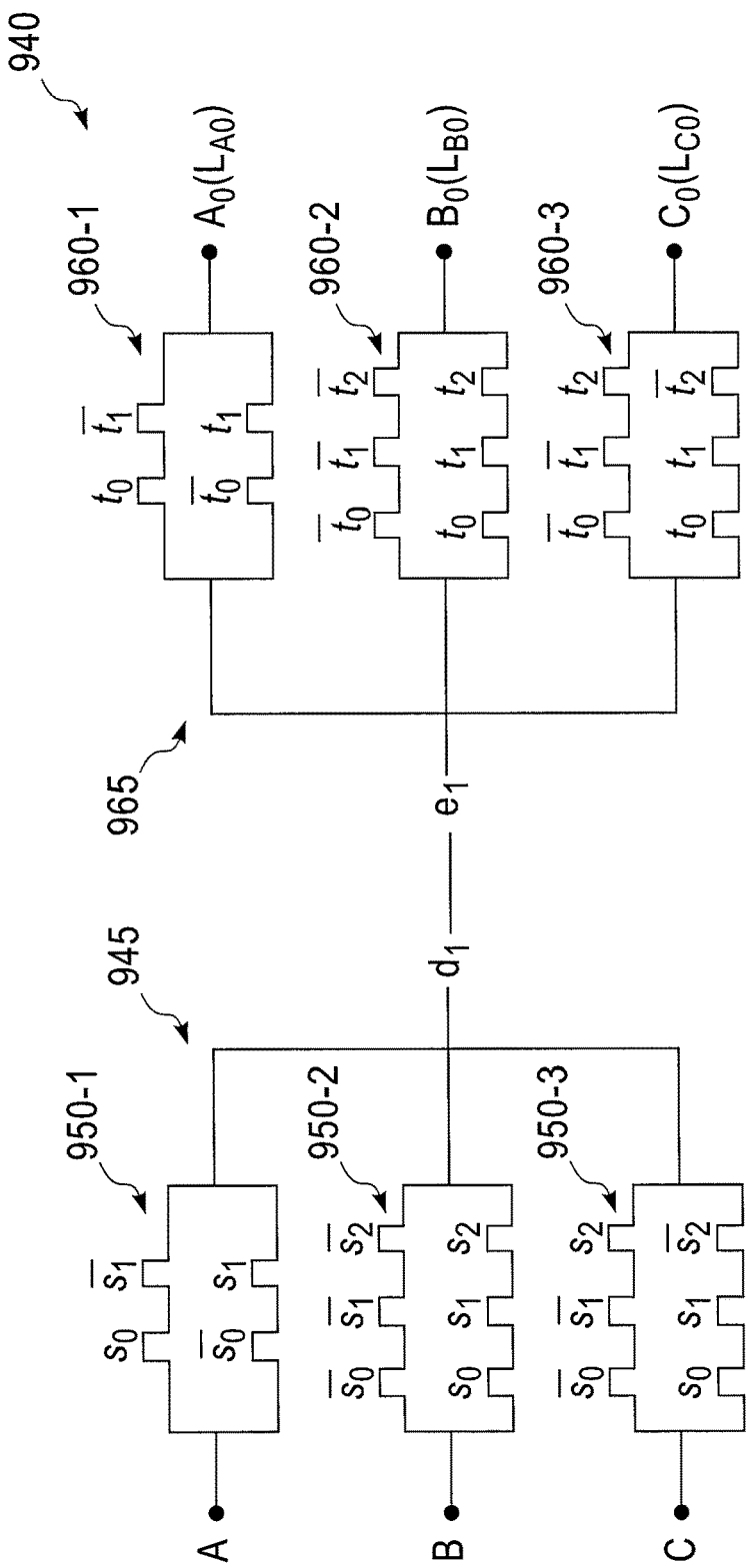
Figure 9C:
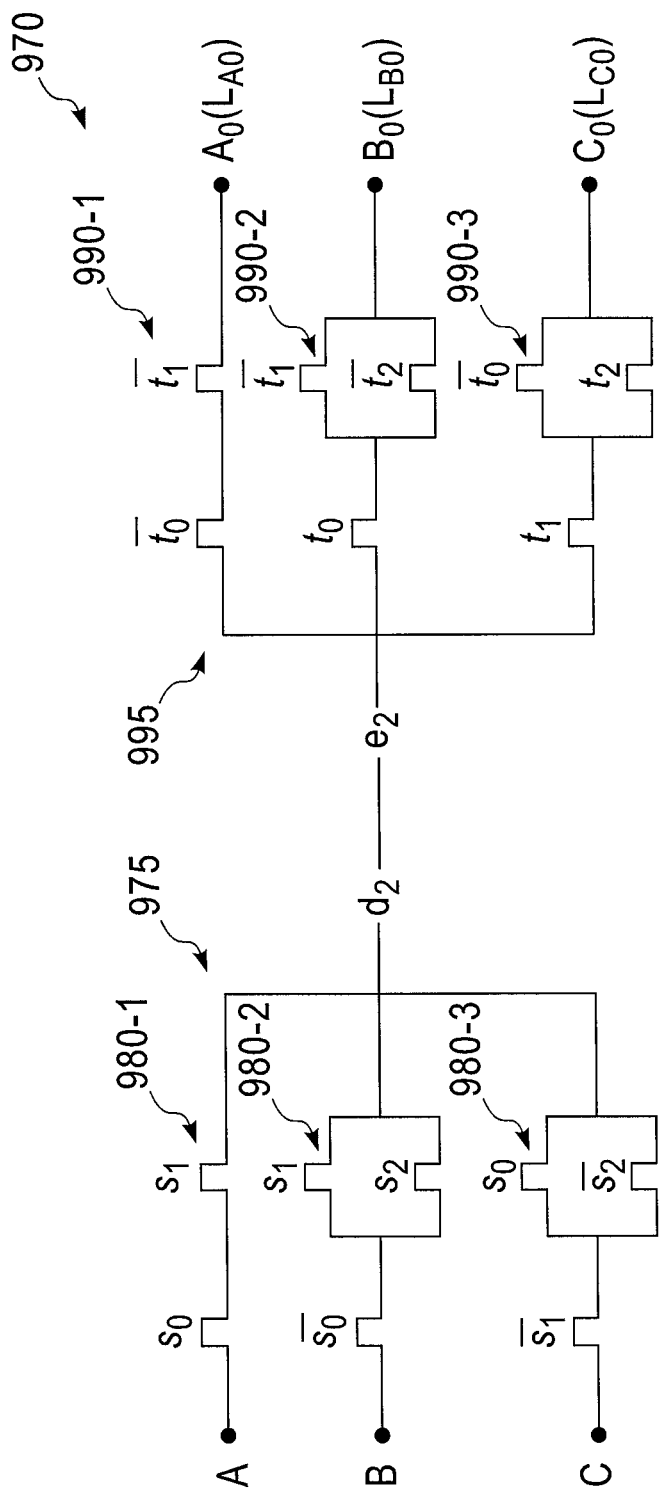
Figure 9D:
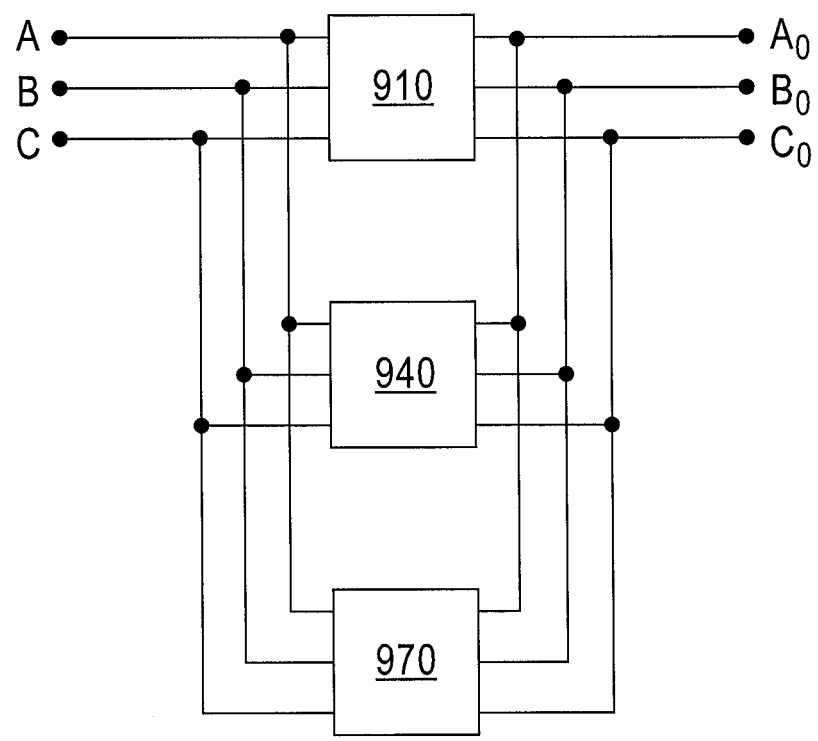

Turning to FIG. 9, including FIGS. 9A, 9B, 9C, and 9D this figure illustrates examples of a circuit including multiplexor circuits suitable for transformer phase permutation. Each of FIGS. 9A, 9B, and 9C illustrate one portion of a total exemplary circuit 900 shown in FIG. 9D. The inputs are A, B, and C, and the outputs are $A_0$ (with data $L_{A0}$), $B_0$ (with data $L_{B0}$), and $C_0$ (with data $L_{C0}$). The pass transmission muxes $e_0$, $e_1$, $e_2$ actually have data flowing through them in reverse (i.e. from outputs $e_0$, $e_1$, $e_2$ to inputs $A_0$, $B_0$, $C_0$). This is why pass transmission muxes are used here since data can flow in either direction. It is further noted in FIGS. 9A,B,C is that pins A,B,C fan out to the three muxes $d_0$, $d_1$, $d_2$. For the descending muxes $e_0$, $e_1$, $e_2$, the pins $A_0$, $B_0$, $C_0$ are dotted together (i.e., logical OR).

FIG. 9A illustrates a circuit 910 includes a multiplexor (mux) circuit 915 for determining $d_0$ and a multiplexor circuit 925 for determining $e_0$. Mux circuit 915 includes three muxes 920-1 (for selection of $A_0$), 920-2 (for selection of $B_0$), and 920-3 (for selection of $C_0$). The mux circuit 925 includes three muxes 930-1 (for selection of $L_{A0}$), 930-2 (for selection of $L_{B0}$), and 920-3 (for selection of $L_{C0}$). Each of the muxes 920 and 930 include a number of transistors that use selection inputs for $s_0$, $s_1$, $s_2$ (or their inverses) or $t_0$, $t_1$, $t_2$ (or their inverses), respectively. The selection inputs can be read from the equations for $d_0$ and $e_0$ presented above.

FIG. 9B illustrates a circuit 940 including a multiplexor (mux) circuit 945 for determining $d_1$ and a multiplexor circuit 965 for determining $e_1$. The inputs are A, B, and C, and the outputs are $L_{A0}$ (e.g., $A_0$), $L_{B0}$ (e.g., $B_0$), and $L_{C0}$ (e.g., $C_0$). Mux circuit 945 includes three muxes 950-1 (for selection of $A_0$), 950-2 (for selection of $B_0$), and 950-3 (for selection of $C_0$). The mux circuit 965 includes three muxes 960-1 (for selection of $L_{A0}$), 960-2 (for selection of $L_{B0}$), and 960-3 (for selection of $L_{C0}$). Each of the muxes 950 and 960 include a number of transistors that use selection inputs for $s_0$, $s_1$, $s_2$ (or their inverses) or $t_0$, $t_1$, $t_2$ (or their inverses), respectively. The selection inputs can be read from the equations for $d_1$ and $e_1$ presented above. It should be noted that $A \oplus B = A\overline{B} + \overline{A}B$ is used for FIGS. 9B and 9C.

FIG. 9C illustrates a circuit 970 including a multiplexor (mux) circuit 975 for determining $d_2$ and a multiplexor circuit 995 for determining $e_2$. The inputs are A, B, and C, and the outputs are $L_{A0}$ (e.g., $A_0$), $L_{B0}$ (e.g., $B_0$), and $L_{C0}$ (e.g., $C_0$). Mux circuit 975 includes three muxes 980-1 (for selection of $A_0$), 980-2 (for selection of $B_0$), and 980-3 (for selection of $C_0$). The mux circuit 995 includes three muxes 990-1 (for selection of $L_{A0}$), 990-2 (for selection of $L_{B0}$), and 990-3 (for selection of $L_{C0}$). Each of the muxes 980 and 990 include a number of transistors that use selection inputs for $s_0$, $s_1$, $s_2$ (or their inverses) or $t_0$, $t_1$, $t_2$ (or their inverses), respectively. The selection inputs can be read from the equations for $d_2$ and $e_2$ presented above.

Referring to FIG. 5, this figure is a table illustrating how to compute the resultant loads $\{P_A, P_B, P_C\}$ from the sorting networks. This table shows certain combinations of the output produced by the sort ascending algorithm, sort ascending functions corresponding to the resultant loads $\{P_A, P_B, P_C\}$, combinations of output produced by the sort descending algorithm, sort descending functions corresponding to the loads $\{L_{A0}, L_{B0}, L_{C0}\}$, and assignments for the resultant loads $\{P_A, P_B, P_C\}$. There are 36 possible combinations, as illustrated by the following. In reference 585-1, the sort descending algorithm has the following output loads (using only the alphabetical subscript for $L_{A0}$, $L_{B0}$, and $L_{C0}$ for clarity): ABC, ACB, BAC, BCA, CAB, and CBA. The sort ascending algorithm is fixed to the following resultant loads $\{P_A, P_B, P_C\}$ (using only the alphabetical subscript for $P_A$, $P_B$, $P_C$ for clarity): ABC. In reference 585-2, the output loads are same output loads ABC, ACB, BAC, BCA, CAB, and CBA, while the loads resultant loads are ACB. Not shown in FIG. 5 are the other combinations of BAC, BCA, CAB, and CBA to which the resultant loads would be set (and for each combination, the output loads are the same output loads ABC, ACB, BAC, BCA, CAB, and CBA). Thus, for each reference 585, there are six combinations and there are six references 585, such that there are 36 total combinations.

The sort ascending functions 520 and the sort descending functions 530 for reference 585-1 are shown for each of the output loads (using only the alphabetical subscript for $L_{A0}$, $L_{B0}$, and $L_{C0}$ for clarity): ABC, ACB, BAC, BCA, CAB, and CBA. Similarly, the sort ascending functions 520 and the sort descending functions 530 for reference 585-1 are shown for each of the output loads (using only the alphabetical subscript for $L_{A0}$, $L_{B0}$, and $L_{C0}$ for clarity): ABC, ACB, BAC, BCA, CAB, and CBA. Each of the resultant loads $P_A$, $P_B$, and $P_C$ are shown, as are their assigned output loads 170 in columns 540, 550, and 560. As illustrated by reference 510, which may indicate the operations taken by a circuit designed to implement the logic for both logic circuit 141 and logic circuit 151, the resultant loads $P_A$, $P_B$, and $P_C$ may be determined using the logic shown in block 510 and below:

$$P_A = \overline{s_0}\overline{s_1}\overline{s_2}t_0t_1t_2 L_{A0} + \overline{s_0}\overline{s_1}s_2 t_0 t_1 \overline{t_2} L_{A0} + \overline{s_0}\overline{s_1}\overline{s_2}t_0 \overline{t_1} L_{B0} + \ldots$$

$$P_B = \overline{s_0}\overline{s_1}\overline{s_2}t_0t_1t_2 L_{B0} + \overline{s_0}\overline{s_1}s_2 t_0 t_1 \overline{t_2} L_{C0} + \overline{s_0}\overline{s_1}\overline{s_2}t_0 \overline{t_1} L_{A0} + \ldots$$

$$P_C = \overline{s_0}\overline{s_1}\overline{s_2}t_0t_1t_2 L_{C0} + \overline{s_0}\overline{s_1}s_2 t_0 t_1 \overline{t_2} L_{B0} + \overline{s_0}\overline{s_1}\overline{s_2}t_0 \overline{t_1} L_{C0} + \ldots \quad \text{[Eq. 1]}$$

For ease of reference, for reference 585-1, certain sort ascending functions 520 have reference numbers 1, 6, and 11 assigned; certain sort descending functions 530 have reference numbers 2, 7, and 12 assigned; the resultant load $P_A$ has reference numbers 3, 8, and 13 assigned to corresponding ones of the output loads 170 in column 540; the resultant load $P_B$ has reference numbers 4, 9, and 14 assigned to corresponding ones of the output loads 170 in column 550; and the resultant load $P_C$ has reference numbers 5, 10, and 15 assigned to corresponding ones of the output loads 170 in column 560. For reference 585-2, certain sort ascending functions 520 have reference numbers 18, 21, and 26 assigned; certain sort descending functions 530 have reference numbers 17, 22, and 27 assigned; the resultant load $P_A$ has reference numbers 18, 23, and 28 assigned to corresponding ones of the output loads 170 in column 540; the resultant load $P_B$ has reference numbers 19, 24, and 29 assigned to corresponding ones of the output loads 170 in column 550; and the resultant load $P_C$ has reference numbers 20, 25, and 30 assigned to corresponding ones of the output loads 170 in column 560. The reference numbers 1-30 are used to illustrate the logic in reference 510 as follows:

$$P_A = 1,2,3 + 6,7,8 + 11,12,13 + \ldots + 16,17,18 + 21,22,23 + 26,27,28 \ldots$$

$$P_B = 1,2,4 + 6,7,9 + 11,12,14 + \ldots + 16,17,19 + 21,22,24 + 26,27,29 \ldots$$

$$P_C = 1,2,5 + 6,7,10 + 11,12,15 + \ldots + 16,17,20 + 21,22, 25 + 26,27,30 \ldots$$

The other elements in the table in FIG. 5 would be similarly defined.

Figure 6:
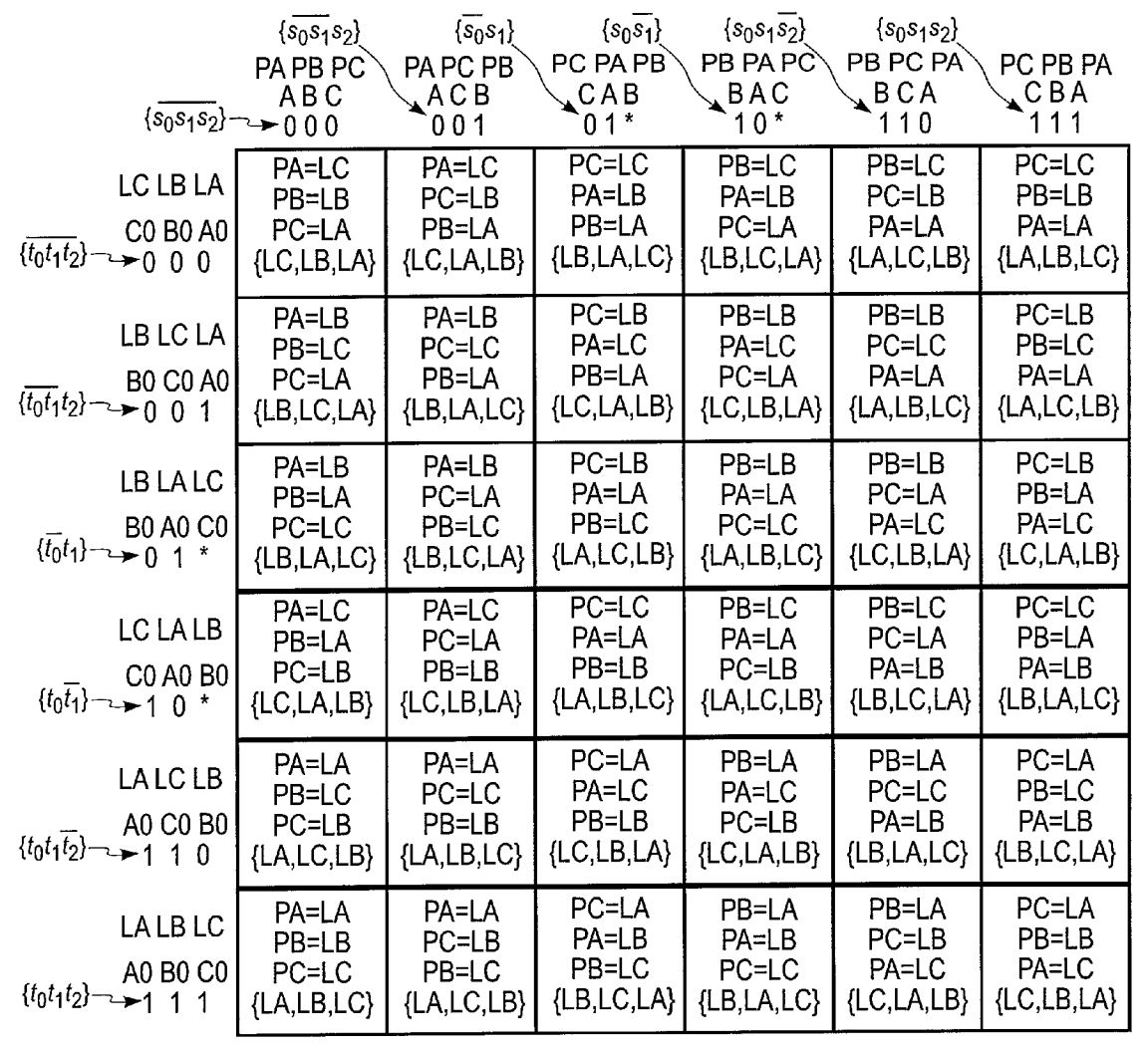

Turning to FIG. 6, this figure illustrates a 6×6 matrix and is another example of how to compute the resultant loads $\{P_A, P_B, P_C\}$ from the sorting networks. This figure is another way of looking at the information in FIG. 5. In the example of FIG. 6, subscripts are not used, so {PA, PB, PC} in the figure mean $\{P_A, P_B, P_C\}$ and {LA, LB, LC} in the figure mean $\{L_{A0}, L_{B0}, L_{C0}\}$. Resultant loads {PA, PB, PC} are assigned to columns and input loads {LA, LB, LC} are assigned to rows in this example. The values such as {0 0 0} under the resultant loads correspond to the values of $\{s_0\ s_1\ s_2\}$, respectively, shown in FIG. 3B. All of the combinations {0 0 0} (for {PA, PB, PC}), {0 0 1} (for {PA, PC, PB}), {0 1 *} (for {PC, PA, PB}), {1 0 *} (for {PB, PA, PC}), {1 1 0} (for {PB, PC, PA}), and {1 1 1} (for {PC, PB, PA}) are shown. The sort ascending functions 520, comprised of some combination of $\{s_0\ s_1\ s_2\}$ or their inverses, are related to the combinations from FIG. 3B as follows: combination {0 0 0} corresponds to $\{\overline{s_0 s_1 s_2}\}$, {0 0 *} corresponds to $\{\overline{s_0}s_1\}$, {1 0 *} corresponds to $\{s_0\overline{s_1}\}$, {1 1 0} corresponds to $\{s_0 s_1 \overline{s_2}\}$, and {1 1 1} corresponds to $\{s_0 s_1 s_2\}$.

Similarly, the values in FIG. 6 such as {0 0 0} under the output loads correspond to the values of $\{t_0\ t_1\ t_2\}$, respectively, shown in FIG. 4B. All of the combinations {0 0 0} (for {LC, PB, LA}), {0 0 1} (for {LB, LC, LA}), {0 1 *} (for {LB, LA, LC}), {1 0 *} (for {LC, LA, LB}), {1 1 0} (for {LA, LC, LB}), and {1 1 1} (for {LA, LB, LC}) are shown. The corresponding output phases $\{A_0, B_0, \text{and } C_0\}$ are shown. The sort descending functions 530, comprised of some combination of $\{t_0\ t_1\ t_2\}$ or their inverses, are related to the combinations from FIG. 4B as follows: combination {0 0 0} corresponds to $\{\overline{t_0 t_1 t_2}\}$, {0 0 1} corresponds to $\{\overline{t_0}\overline{t_1}t_2\}$, {0 1 *} corresponds to $\{\overline{t_0}t_1\}$, {1 0 *} corresponds to $\{t_0\overline{t_1}\}$, {1 1 0} corresponds to $\{t_0 t_1 \overline{t_2}\}$, and {1 1 1} corresponds to $\{t_0 t_1 t_2\}$.

The outputs $\{s_0\ s_1\ s_2\}$ from the sort ascending network (e.g., logic circuit 141) are used to select the row and the outputs $\{t_0\ t_1\ t_2\}$ from the sort descending network (e.g., logic circuit 151) are used to select the column. Each entry in the matrix of FIG. 6 shows how {PA, PB, PC} are related to {LA, LB, LC}, and additionally each entry includes the {LA, LB, LC} assignments in order of {PA, PB, PC}. Everything in the first column from the left corresponds to PA PB PC, and the other columns are similarly defined. Everything in the first row from the top corresponds to LC LB LA and the other rows are similarly defined. For instance, the first column (from the left) and first row (from the top) has PA=LC, PB=LB, and PC=LA. This is easily read off the table, as the first column (from the left) corresponds to PA PB PC, each of which corresponds to LC LB LA, respectively. In order from PA, to PB, then to PC, the assignments are {LC, LB, LA}, respectively. Consider as another example as the fifth column from the left and the fourth row from the top, where all entries in the fifth column correspond to PB PC PA and all entries in the fourth row correspond to LC LA LB. Therefore, PB=LC, PC=LA and PA=LB. In order from PA, to PB, then to PC, the assignments are {LB, LC, LA}, respectively.

Eq. 1 above may also be determined using the matrix shown in FIG. 6. For instance, looking at the entry at the leftmost row and bottommost column, each of $L_A$, $L_B$, and $L_C$ is associated with $\overline{s_0 s_1 s_2 t_0 t_1 t_2}$; looking at the entry at the leftmost row and the column one column up from the bottommost column, each of $L_A$, $L_B$, and $L_C$ is associated with $\overline{s_0 s_1 s_2 t_0 t_1}\overline{t_2}$; and looking at the entry at the leftmost row and the column two columns up from the bottommost column, each of $L_A$, $L_B$, and $L_C$ is associated with $\overline{s_0 s_1 s_2 t_0}t_1$.

These are the first three entries in Eq. 1 and the other entries may be similarly defined simply by looking at the matrix in FIG. 6.

Figure 7:
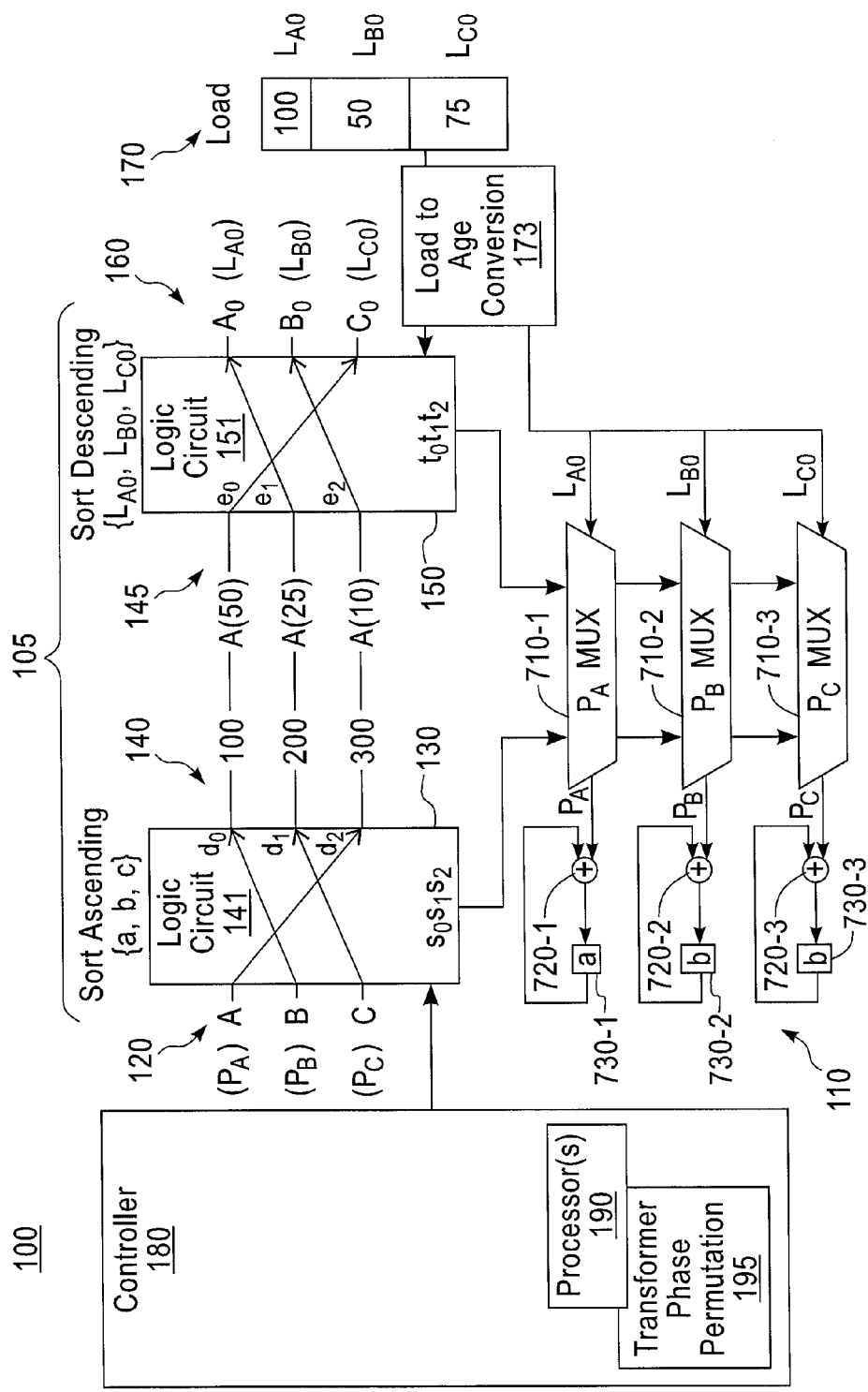
FIG. 7 is a block diagram of an exemplary system for performing transformer phase permutation to minimize transformer aging, shown at the first iteration from FIG. 1A.

Each of $P_A$, $P_B$, and $P_C$ may be determined using a 36-way multiplexor (MUX) as shown in FIG. 7. FIG. 7 is a block diagram of an exemplary system for performing transformer phase permutation to minimize transformer aging, shown at the first iteration from FIG. 1A. In this example, the controller 180 may or may not retain the one or more processors 190, but typically is used to control (e.g., using the transformer phase permutation process 195) the transformer phase permutation system 100, e.g., to cause the system 100 to change every time the load 170 changes, at periodic intervals, or in response to a signal or command from another entity (e.g., under control of a power plant operator). In another exemplary embodiment, the controller may not be needed, and the system 100 would be configured to implement transformer phase permutation at certain times.

As previously discussed, it is noted power flows from A,B,C to $A_0$, $B_0$, $C_0$, and that the latched values a,b,c and $L_{A0}$, $L_{B0}$, $L_{C0}$ are inputs to comparators which compute selects for muxes to determine how power flows in the switching network. Also, after updating a,b,c the state of $L_{A0}$, $L_{B0}$, $L_{C0}$ should be reset to zero, indicating that a new time interval for transformer aging has begun.

The $L_{A0}$, $L_{B0}$, and $L_{C0}$ are data inputs to 36-way muxes 710-1, 710-2 and 710-3. The outputs $\{s_0\ s_1\ s_2\}$ from the sort ascending network (e.g., logic circuit 141) and the outputs $\{t_0\ t_1\ t_2\}$ from the sort descending network (e.g., logic circuit 151) are used to select the corresponding $P_A$, $P_B$, or $P_C$, respectively. Each mux 710-1, 710-2 or 710-3 produces a corresponding output $P_A$, $P_B$, or $P_C$, respectively. The outputs may be described as the following: $P_A$=mux36($L_A$, $L_B$, $L_C$, $s_0$, $s_1$, $s_2$, $t_0$, $t_1$, $t_2$); $P_B$=MUX36($L_A$, $L_B$, $L_C$, $s_0$, $s_1$, $s_2$, $t_0$, $t_2$); and $P_C$=mux36($L_A$, $L_B$, $L_C$, $s_0$, $s_1$, $s_2$, $t_0$, $t_1$, $t_2$), where $L_A$, $L_B$, $L_C$ are data and $s_0$, $s_1$, $s_2$, $t_0$, $t_1$, $t_2$ select a corresponding $P_A$, $P_B$, or $P_C$. For instance, the selection may be considered to be a selection of an entry in the matrix shown in FIG. 6. A mux's selection may also be considered to implement a corresponding equation from Eq. 1 described above. The corresponding output $P_A$, $P_B$, or $P_C$ is added using a corresponding adder 720-1, 720-2, or 720-3, respectively. The adders 720 add the output of $P_A$, $P_B$, or $P_C$ to a previous version of a, b, or c, respectively. Each latch 730-1, 730-2, or 730-3 latches the current ages a=a+$P_A$, b=b+$P_B$, or c=c+$P_C$, respectively. That is, for instance, the current age a is the previous (e.g., latched) version of age a plus the current $P_A$. In this case, the historical aging information is stored in the latches 730.

It is noted that the calculations described above for the sort ascending network, the sort descending network, the load to age conversion logic circuit 173, the muxes 710, the adders 720, and the latches 730 may be performed by one or more processors such as processor(s) 190. The processors would then control hardware such as relays to couple the phases 120 to the proper output loads 170. In another exemplary embodiment, such as in FIG. 1A, the one or more processors 190 may receive the ($L_A$, $L_B$, $L_C$, $s_0$, $s_1$, $s_2$, $t_0$, $t_1$, $t_2$) information and perform the operation of the muxes 710, the adders 720, and the latches 730. In particular, the historical aging information 110 based on previous historical aging information 110 and current historical aging information (e.g., from output 175) and the selection of $P_A$, $P_B$, and $P_C$ using ($L_A$, $L_B$, $L_C$, $s_0$, $s_1$, $s_2$, $t_0$, $t_1$, $t_2$). The techniques illustrated in regard to FIGS. 5 and 6 may be used to determine the $P_A$, $P_B$, and $P_C$.

It is noted that the above are merely exemplary. There are obviously other variations, such as age sorting in an ascending manner and load sorting in a descending manner. Furthermore, although emphasis is placed on three-phase transformers, the exemplary embodiments may be applicable to other transformers, such as two-phase transformers.

Figure 8:
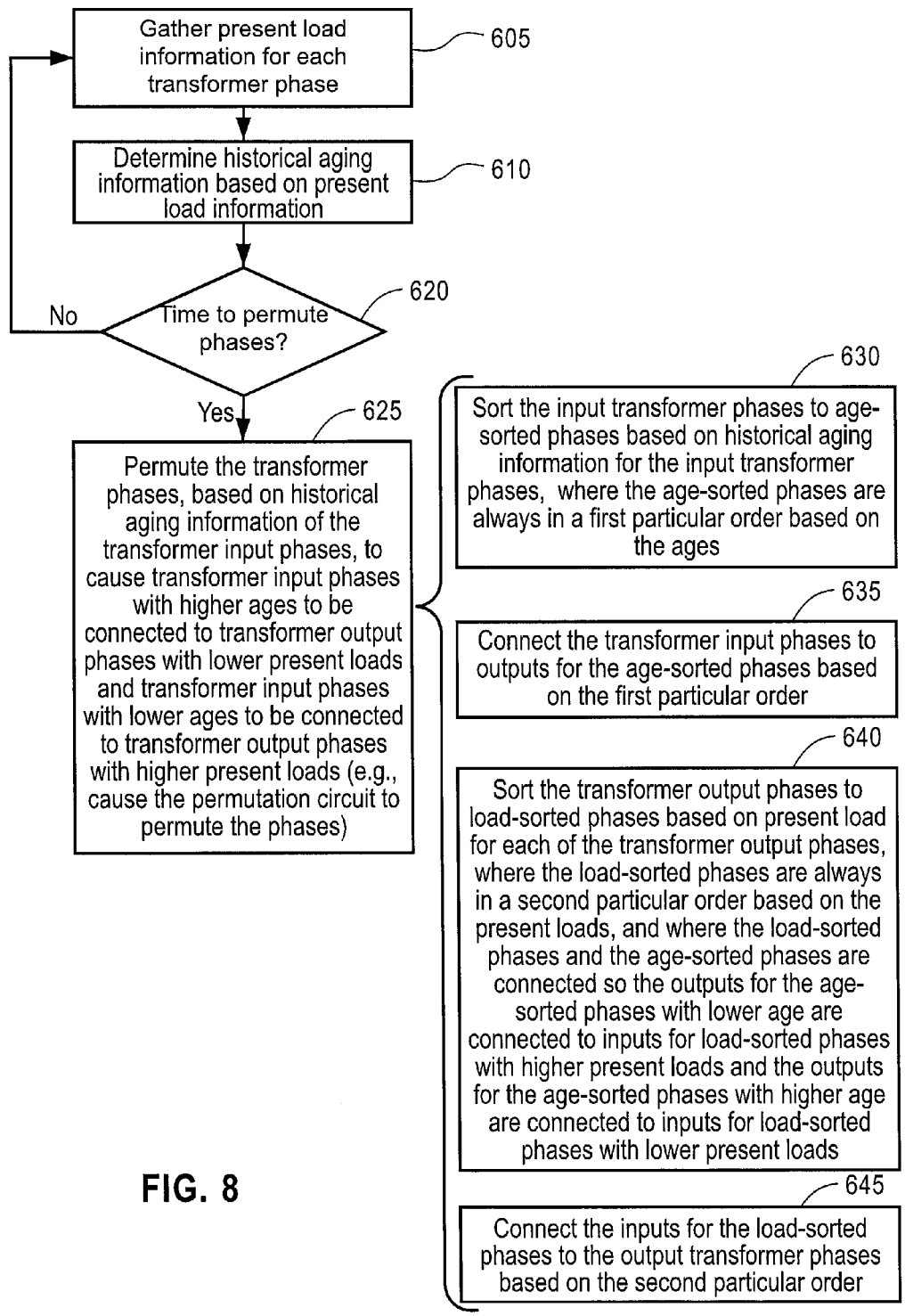
FIG. 8 is a logic flow diagram for performing transformer phase permutation for minimizing transformer aging, and illustrates the operation of an exemplary method, a result of execution of computer program instructions embodied on a computer readable memory, and/or functions performed by logic implemented in hardware, in accordance with an exemplary embodiment.

Turning to FIG. 8, this figure is a logic flow diagram for performing transformer phase permutation for minimizing transformer aging. This figure also illustrates the operation of an exemplary method, a result of execution of computer program instructions embodied on a computer readable memory, and/or functions performed by logic implemented in hardware, in accordance with an exemplary embodiment. It should be noted that the blocks in the figure may be interconnected means for performing the functions in the blocks.

The blocks in FIG. 8 are assumed to be performed by the transformer phase permutation system 100. In block 605, the transformer phase permutation system 100 gathers output load information 170 for each transformer phase. This block may be performed by the controller 180 in FIG. 1A, for instance, using the output loads 170. In block 610, the transformer phase permutation system 100 determines historical aging information 110 based on the output load information 170. One exemplary technique for performing this is the IEEE loss-of-life based on hot-spot temperature, as described above. Load to age conversion may also be performed as described in the following: IEEE Standard C57.91-1995, "IEEE Guide for Loading Mineral-Oil-Immersed Transformers" (1995); and IEEE Standard IEC 60076-6, "Power Transformers Part 7: Loading guide for oil-immersed power transformers" (2005). Block 610 may be performed, e.g., by the controller 180.

In block 620, the transformer phase permutation system 100 determines if it is time to permute the transformer phases. Block 620 may be performed, e.g., by the controller 180. If it is not time to permute the phases (block 620=No), the flow proceeds to block 605. If it is time to permute the phases (block 620=Yes), the flow proceeds to block 625.

In block 625, the transformer phase permutation system 100 permutes the transformer phases, based on historical aging information of the transformer input phases, to cause transformer input phases with higher age to be connected to transformer output phases with lower output load and transformer input phases with lower age to be connected to transformer output phases with higher output load. This is shown, e.g., in FIG. 1A, where the input phase A 120 (with the highest age) is connected to the output phase $B_0$ 160 with the lowest output load $L_{B0}$ 170, the input phase C 120 (with a middle age but one that is lower than the age of input phase A 120 but higher than the age of the input phase B 120) is connected to the output phase $A_0$ 160 with a middle output load $L_{A0}$ 170 (but one that is higher than the lowest output load $L_{B0}$ 170 or lower than the highest output load $L_{C0}$ 170), and where the input phase B 120 (with the lowest age) is connected to the output phase $C_0$ 160 with the highest output load $L_{C0}$ 170. Block 625 may be considered to be performed by the permutation circuit 105. As described above, block 625 may also be considered to be performed (at least in part) by the controller 180, which may cause the permutation circuit 105 to permute the phases.

Regarding block 625 as being performed by the permutation circuit 105, blocks 630, 635, 640, and 645 are examples of block 625. In block 630, the permutation circuit 105 (e.g., the age sorting network 130) sorts the input transformer phases to age-sorted phases 140 based on historical aging information for the input transformer phases.

The age-sorted phases 140 are always in a first particular order based on the ages (as shown in FIG. 1A, where the order is descending, although the order could also be ascending). In block 635, the permutation circuit 105 (e.g., the age sorting network 130) connects the transformer input phases 120 to outputs for the age-sorted phases 140 based on the particular order.

In block 640, the permutation circuit 105 (e.g., the load sorting network 150) sorts the transformer output phases 160 to load-sorted phases 145 based on output load 170 for each of the transformer output phases 160. The load-sorted phases 145 are always in a second particular order based on the output loads 170, as seen in FIG. 1A, where the order is ascending, although the order could be descending too. The load-sorted phases 145 and the age-sorted phases 140 are connected so the outputs for the age-sorted phases 145 with lower age are connected to inputs for load-sorted phases 145 with higher output loads. In block 645, the permutation circuit 105 (e.g., the load sorting network 150) connects the inputs for the load-sorted phases 145 to the output transformer phases 160 based on the second particular order.

In a logic implantation such as those shown in FIGS. 3A and 3B for the age sorting network 130, blocks 630 and 635 may be performed approximately in parallel, as the logic circuit for the age sorting network 130 performs sorting (block 630) and the connecting (block 635) is made shortly after the sorting. Similarly, blocks 640 and 645 for a logic implantation such as those shown in FIGS. 4A and 4B may be performed approximately in parallel, as the logic circuit for the load sorting network 150 performs sorting (block 640) and the connecting (block 645) is made shortly after the sorting. In the example of FIGS. 5 and 6, blocks 630, 635, 640, and 645 may be considered to all be performed approximately in parallel.

Although described above mainly in relation to transformer again, the circuits shown above are general switching networks that sort (e.g., ascending) A,B,C and sort (e.g., descending) $A_0$, $B_0$, $C_0$ and makes connections from input to output. Transformer aging is just a particular application of the general switching networks.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
a first sorting network comprising a first logic circuit configured to sort input signals A, B, C, wherein the sorting is performed so the signals A, B, C are always in a first particular order based on values of the signals A, B, C, and wherein the first logic circuit is further configured to connect the input signals A, B, C to first outputs based on the first particular order;
a second sorting network comprising a second logic circuit configured to sort output signals $A_0$, $B_0$, $C_0$ to second outputs based on values of the output signals $A_0$, $B_0$, $C_0$, wherein the sorting is performed so the second outputs are always in a second particular order based on the values of the output signals $A_0$, $B_0$, $C_0$, and wherein the second logic circuit is further configured to connect the second outputs to the output signals $A_0$, $B_0$, $C_0$, based on the second particular order; and
connection circuitry configured so that first outputs and the second outputs are connected so the first outputs with lower input-signal values in the first particular order are connected to second outputs with higher output-signal values in the second particular order and the first outputs with higher input-signal values in the first particular order are connected to second outputs with lower output-signal values in the second particular order, wherein:

the first logic circuit is configured to sort input transformer phases to age-sorted phases based on historical aging information for the input transformer phases, wherein the sorting is performed so the age-sorted phases are always in a first particular order based on corresponding ages of the input transformer phases, the first logic circuit further configured to connect the transformer input phases to outputs for the age-sorted phases based on the first particular order;

the second logic circuit is configured to sort transformer output phases to load-sorted phases based on output load for each of the transformer output phases, wherein the sorting is performed so the load-sorted phases are always in a second particular order based on the output loads, wherein the second logic circuit is further configured to connect the inputs for the load-sorted phases to the output transformer phases based on the second particular order; and the connection circuitry is configured so that load-sorted phases and the age-sorted phases are connected so the outputs for the age-sorted phases with lower age are connected to inputs for load-sorted phases with higher output loads and the outputs for the age-sorted phases with higher age are connected to inputs for load-sorted phases with lower output loads.

2. The apparatus of claim 1, wherein there are three input transformer phases, and there are three output transformer phases.

3. The apparatus of claim 2, wherein the first logic circuit outputs three signals $s_0$, $s_1$, $s_2$, the second logic circuit outputs three signals $t_0$, $t_1$, $t_2$, and the apparatus further comprises three multiplexors, where each multiplexor selects a corresponding one of three resultant loads based on the signals $s_0$, $s_1$, $s_2$, the signals $t_0$, $t_1$, $t_2$, and the output loads, wherein each of the three resultant loads is a load on a corresponding one of the three transformer phases.

4. The apparatus of claim 3, wherein each multiplexor performs a 36-way selection based on permutations of combinations of possible output loads and possible resultant loads.

5. The apparatus of claim 3, further comprising:

three adders, each adder adding a corresponding one of the resultant loads, after conversion to an age, with a previous value of historical aging information for a corresponding one of the input phases; and three latches, each latch latching an output of a corresponding one of the three adders.

6. The apparatus of claim 2, wherein the first logic circuit outputs three signals $s_0$, $s_1$, $s_2$, the second logic circuit outputs three signals $t_0$, $t_1$, $t_2$, and the permutation circuit further comprises at least one processor, which in response to executing computer-readable code selects a corresponding one of three resultant loads based on the signals $s_0$, $s_1$, $s_2$, the signals $t_0$, $t_1$, $t_2$, and the output loads, wherein each of the three resultant loads is a load on a corresponding one of the three transformer phases.

* * * * *